(12) United States Patent
Roberts

(10) Patent No.: US 6,462,955 B1
(45) Date of Patent: Oct. 8, 2002

(54) COMPONENT ALIGNMENT CASING SYSTEM

(75) Inventor: Jonathan F. Roberts, Litchfield, NH (US)

(73) Assignee: Miraco, Inc., Manchester, NH (US)

( * ) Notice: Subject to any disclaimer, the term of this patent is extended or adjusted under 35 U.S.C. 154(b) by 0 days.

(21) Appl. No.: 09/395,006

(22) Filed: Sep. 13, 1999

(51) Int. Cl.$^7$ ................................................ H05K 7/10
(52) U.S. Cl. ........................ 361/760; 361/752; 361/759; 361/808; 174/268; 174/52.1; 439/620
(58) Field of Search ................................ 361/760, 761, 361/784, 787, 789, 801, 720, 734, 749, 752, 759, 757, 813, 807–810; 439/620; 174/268, 117 FF, 52.1

(56) References Cited

U.S. PATENT DOCUMENTS

| | | | | |
|---|---|---|---|---|
| 4,464,832 A | * | 8/1984 | Asick et al. | 174/255 |
| 4,740,867 A | * | 4/1988 | Roberts et al. | 361/749 |
| 4,993,968 A | | 2/1991 | Guletsky et al. | |
| 5,047,162 A | * | 9/1991 | Krug et al. | 439/75 |
| 5,306,162 A | * | 4/1994 | Armendariz | 439/67 |
| 5,674,078 A | | 10/1997 | Davis et al. | 9/9 |
| 6,146,190 A | * | 11/2000 | Fuerst et al. | 439/496 |
| 6,205,031 B1 | * | 3/2001 | Herzog et al. | 361/760 |
| 6,259,345 B1 | * | 7/2001 | De Graaf et al. | 29/602.1 |

* cited by examiner

Primary Examiner—David Martin
Assistant Examiner—Hung Bui
(74) Attorney, Agent, or Firm—Devine, Millimet & Branch, PA; Paul C. Remus; Todd A. Sullivan

(57) ABSTRACT

A component alignment casing system for connecting circuits, and a method for making or assembling the component alignment casing system is disclosed. The system has at least one surface mountable component which has a plurality of exposed leads, a prepared component which has a plurality of exposed traces, an alignment base onto which the prepared component and the surface mountable component are laid, and a compressive cover that attaches to said alignment base. The alignment base has a plurality of alignment ribs to isolate and align the exposed traces of the prepared component. The prepared component and surface mountable components are electrically connected and attached together, preferably by soldering. The method comprises laying the prepared component on the alignment base and ribs, and overlaying the surface mountable component, with its exposed leads, on to the alignment base and the prepared component, and electrically connecting the components together, preferably by soldering, to the alignment base. The cover is then snapped on, and supplies compressive force to assure good contact between the leads of the surface mountable component and the traces of the prepared component.

14 Claims, 8 Drawing Sheets

COMPONENT ALIGNMENT CASING SYSTEM

BACKGROUND OF THE INVENTION

In today's electronics market, manufacturers are placing emphasis on increasing their product's reliability and reducing assembly costs to remain competitive. A primary focus of each manufacturer is to reduce the cost and increase the circuit density associated with interconnecting the sub-assemblies and components found within its products. Another emerging focus in today's electronics market is to pack more electronic functions into smaller packages. This means higher density modules, each requiring multiple high density interconnections to other modules.

In electrical systems, flexible printed circuits are employed as electrical jumpers or cables for interconnecting rows of terminal pins or pads of printed circuit board. Such flexible printed circuits are generally connected to a printed circuit board using a connector. Conventional connector manufacturers compete with each other using the same basic technology, individual stamped contacts molded into a plastic housing. This structure is then soldered to a printed circuit board (PCB) and is then ready to receive a flexible jumper or interconnect circuit. Many of these conventional connectors are of the zero insertion force (ZIF) variety, which require the application of minimal forces during the process of inserting the flexible circuit into the connector. These ZIF connectors thus reduce the likelihood of circuit damage during the connection process.

All of today's ZIF connectors use either the edge of the interconnect circuit or a precisely located hole to accurately align the conductors of the flexible circuit to the connector's contacts. This requires circuit manufacturers to precisely control both the thickness and width of a flexible circuit's terminating ends. Generally, tolerances must be maintained within 0.003 inches. To accurately outline a circuit and control the required tolerances requires an expensive precise outline die. Another obstacle encountered in conventional circuit connector technology centers around a tendency of flexible circuits to shrink somewhat after their manufacture. When working with larger flexible circuits, the shrinkage problem can be significant enough to result in significant alignment problems. As such, outline dies are usually constrained to outline a 6 inch by 6 inch area. This size restriction adds labor costs and reduces yield.

In addition to size restrictions, flexible circuits also require the precise attachment of a support stiffener. This stiffener is required to lift the circuits into connection with a conventional connector's contacts and add the structural support necessary to ensure the thin flexible circuit enters into the connector's opening. The precise outlining and stiffener attachment process is cumbersome and costly and frequently the cause of poor yields and system failures.

Conventional connectors also utilize internal spring assemblies in order to ensure that jumpers or flexible circuits maintain adequate contact with the connector's contacts. However, until now, these connectors have incorporated a single spring assembly for each conductor. The physical size required to manufacture an acceptable spring contact eliminates this technology in high-density circuits using microminiature connectors which will eventually require conductors on 0.006 inch pitch centers.

Thus there is a need for a microminiature apparatus to properly attach surface mounted components to flat flexible cable, or flexible printed circuit, and which requires minimal manufacturing and assembly costs, yet provides high quality connection.

SUMMARY OF THE INVENTION

A preferred embodiment of the present invention is a connection assembly or system to assemble surface mountable components to flat flexible cable (FFC), flexible printed circuits (FPC), and round wire interconnect (RWI). It is not a connector itself. The invention comprises surface mountable connector components (headers, receptacles, LED's etc.); prepared components such as FFC, FPC, or RWI, which are prepared by removing the insulation and exposing the traces; an alignment base having alignment ribs; and a cover. To assemble the component alignment casing system, the prepared component (FFC, FPC or RWI) is overlaid on to the alignment base, by hand if desired, the surface mountable component is applied to the alignment base overlaying the prepared component, by hand if desired. Then the exposed traces of the prepared component are soldered to the exposed leads of the surface mountable component (for example, a header, receptacle, LED, etc.), and the cover is attached, by hand if desired.

The system of the present invention aligns a surface mountable connector or component to an FFC, FPC or RWI. It does not align the internal components of a connector, and it is not an electrical connector by itself or by nature, it is an assembly system. The system is an apparatus that is used to properly attach surface mountable components to FFC, FPC or RWI. The system does so by ensuring an accurate alignment between the leads or traces of a surface mountable component and the leads or traces of the FFC, FPC or RWI, while maintaining isolation between the opposing leads or traces of the FFC, FPC, or RWI, thereby insuring against bridging (when a trace makes contact with another trace of the came component) using the alignment ribs or fins. This allows for "blind assembly", an assembly which can take place without the use of magnifying optics which are typically needed for similar assemblies.

The component alignment system of the present invention can be disassembled for reworking rejects, or for other reasons, without damaging either the flexible interconnection medium or the connector components. The cover is removable and provides positive force to the leads of a surface mountable component to assure contact between the surface mountable component and the prepared component (FFC, FPC, or RWI). The solder can be reflowed and the surface mountable component, and the prepared flexible interconnection component or medium, can be removed from each other and from the alignment base. The simple design provides multiple manufacturing options for handling different production volumes. The assembly of the system can be done manually, semi-automated, or fully automated. The simple design makes it possible to be assembled by customers, because there is no custom assembly equipment needed. Because all of the involved parts align off of the same source, i.e. the base of the casing, the alignment tolerance stack up is lower than conventional practices.

The alignment ribs prevent bridging between conductors of the same component (leads or traces) during soldering, which in turn eliminates the requirement for expensive precision soldering equipment and lowers the reject rate. Typical manufacturing methods to mount surface mountable components to the FFC, FPC, or RWI have no manner to prevent solder bridging.

DETAILED DESCRIPTION OF THE PREFERRED EMBODIMENT

Figure 1:
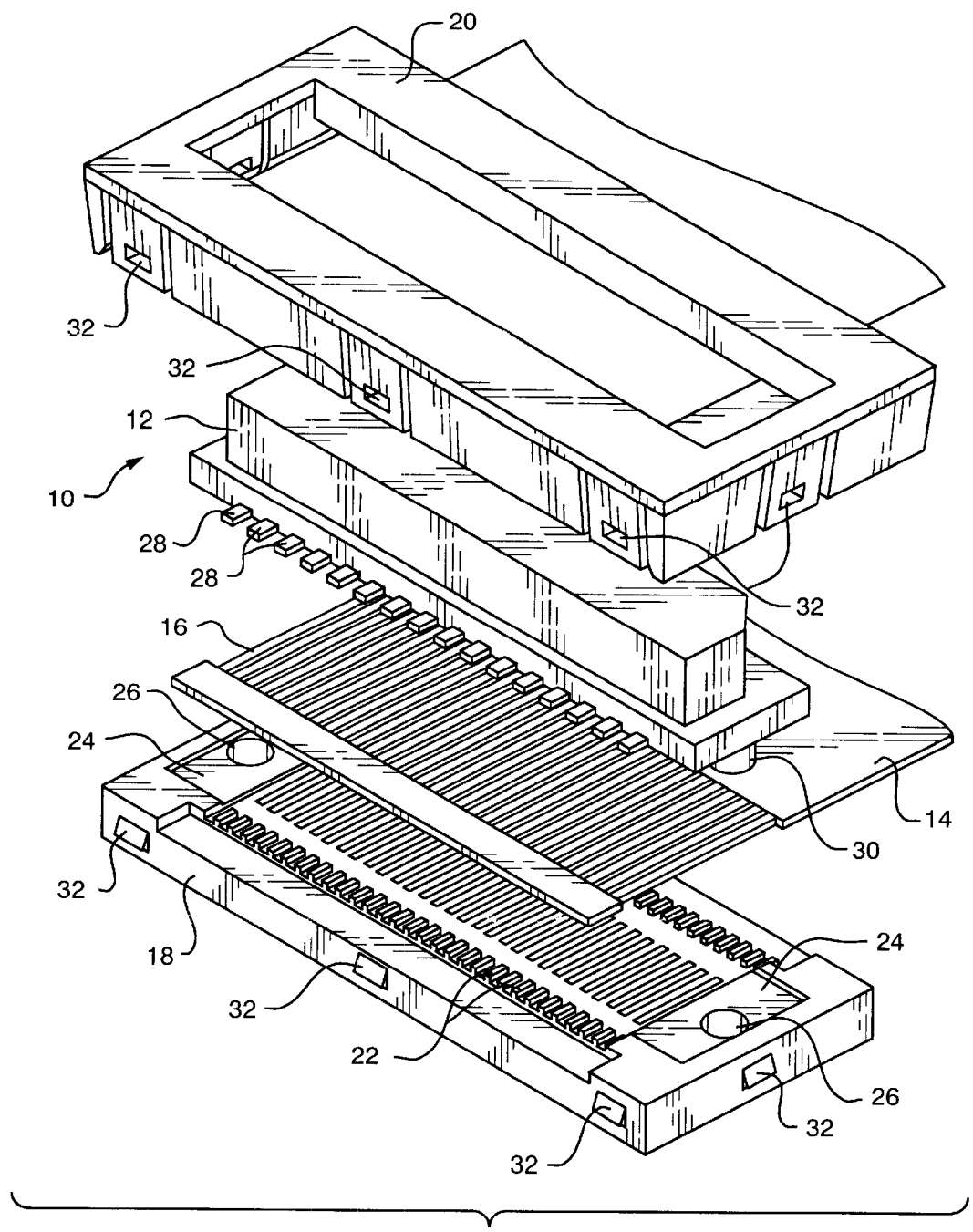
FIG. 1 is an exploded view of the invention using a header as the surface mountable connector component.
Figure 2:
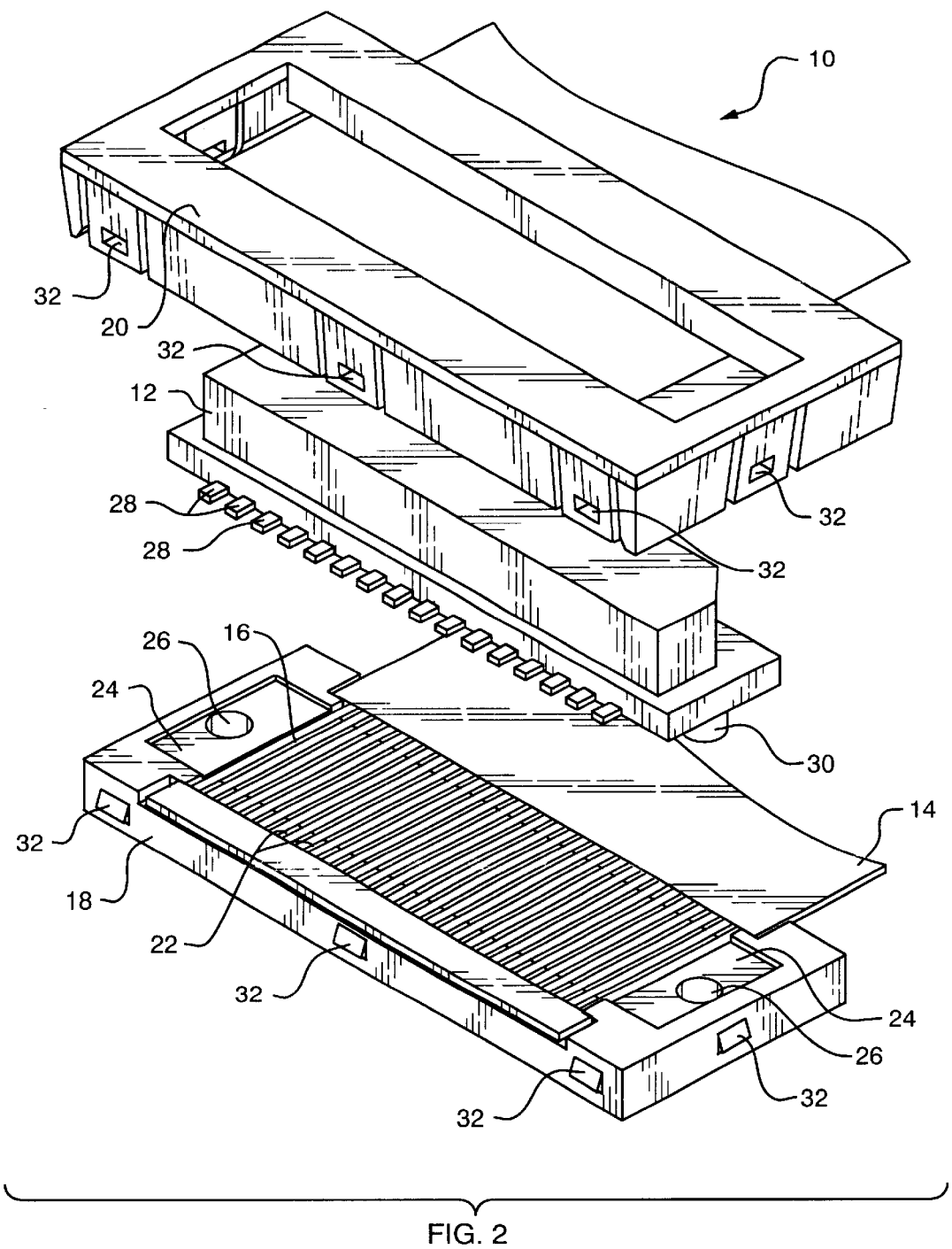
FIGS. 2 and 3 are perspective views of the invention in various stages of assembly, using a header as the surface mountable connector component.
Figure 3:
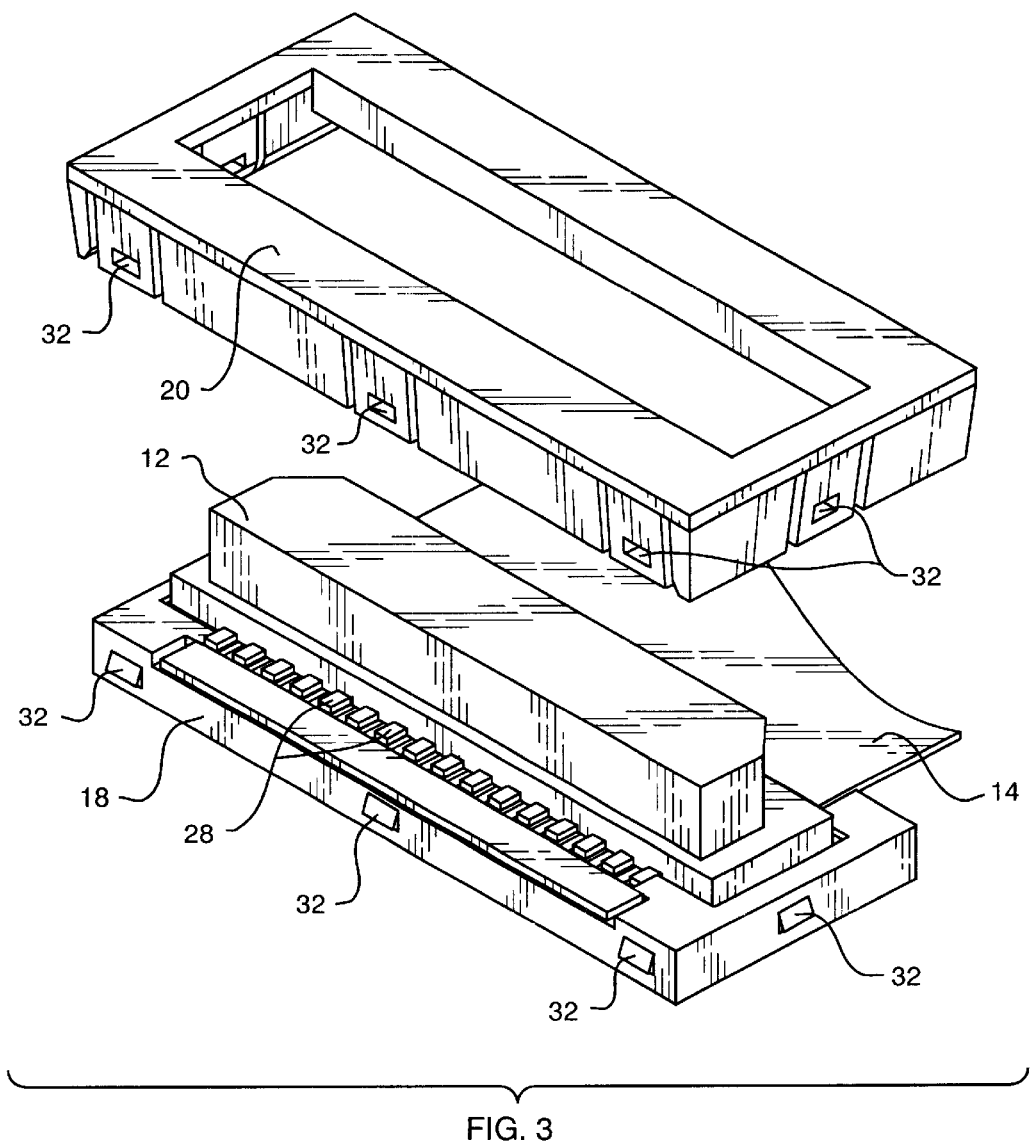
Figure 4:
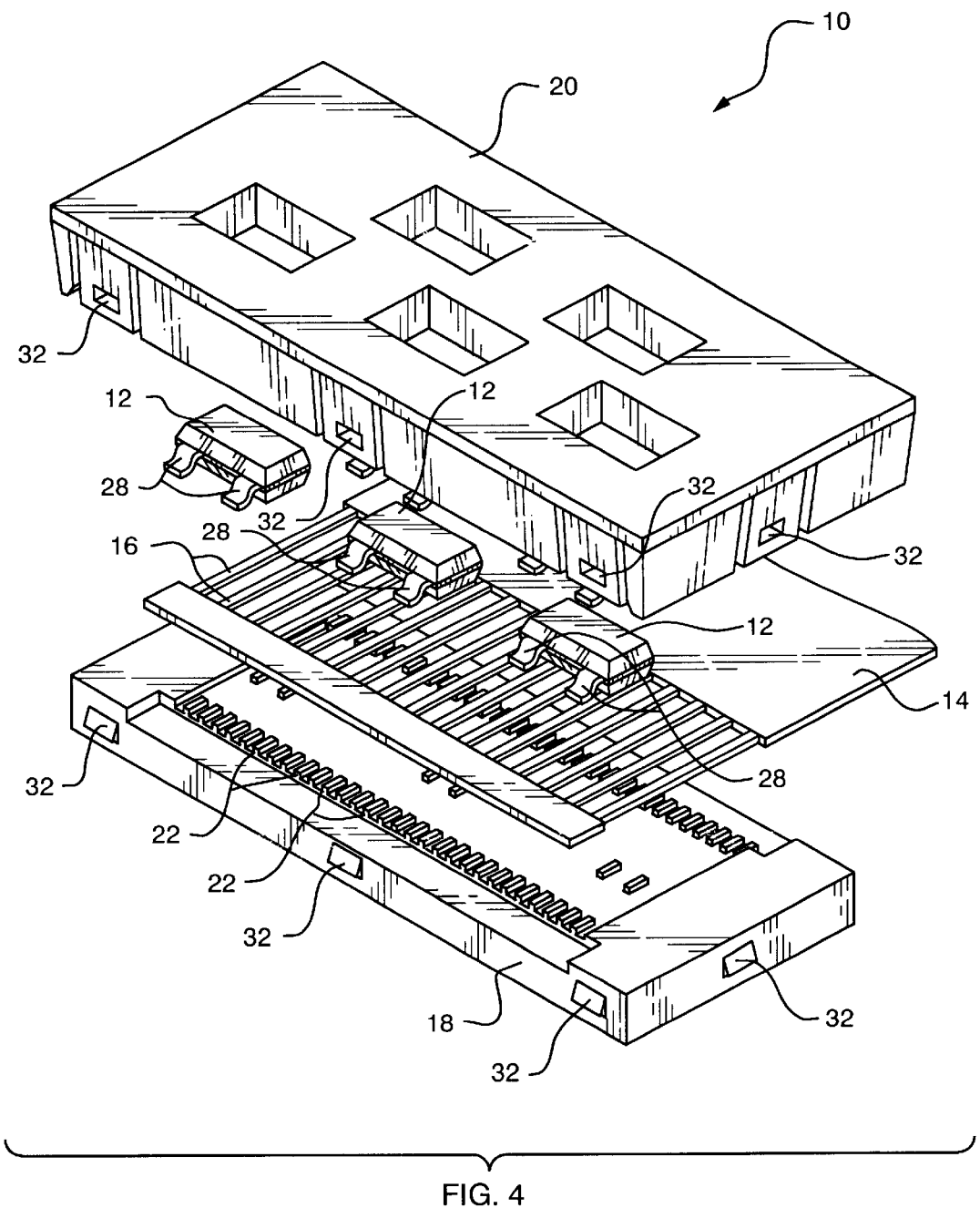
FIGS. 4, 5, and 6 are exploded perspective views of the invention, in various stages of assembly, using LED's as the surface mountable component, with FIGS. 4, and 5 showing use of three (3) LED's and FIG. 6 showing use of five (5) LED's.
Figure 5:
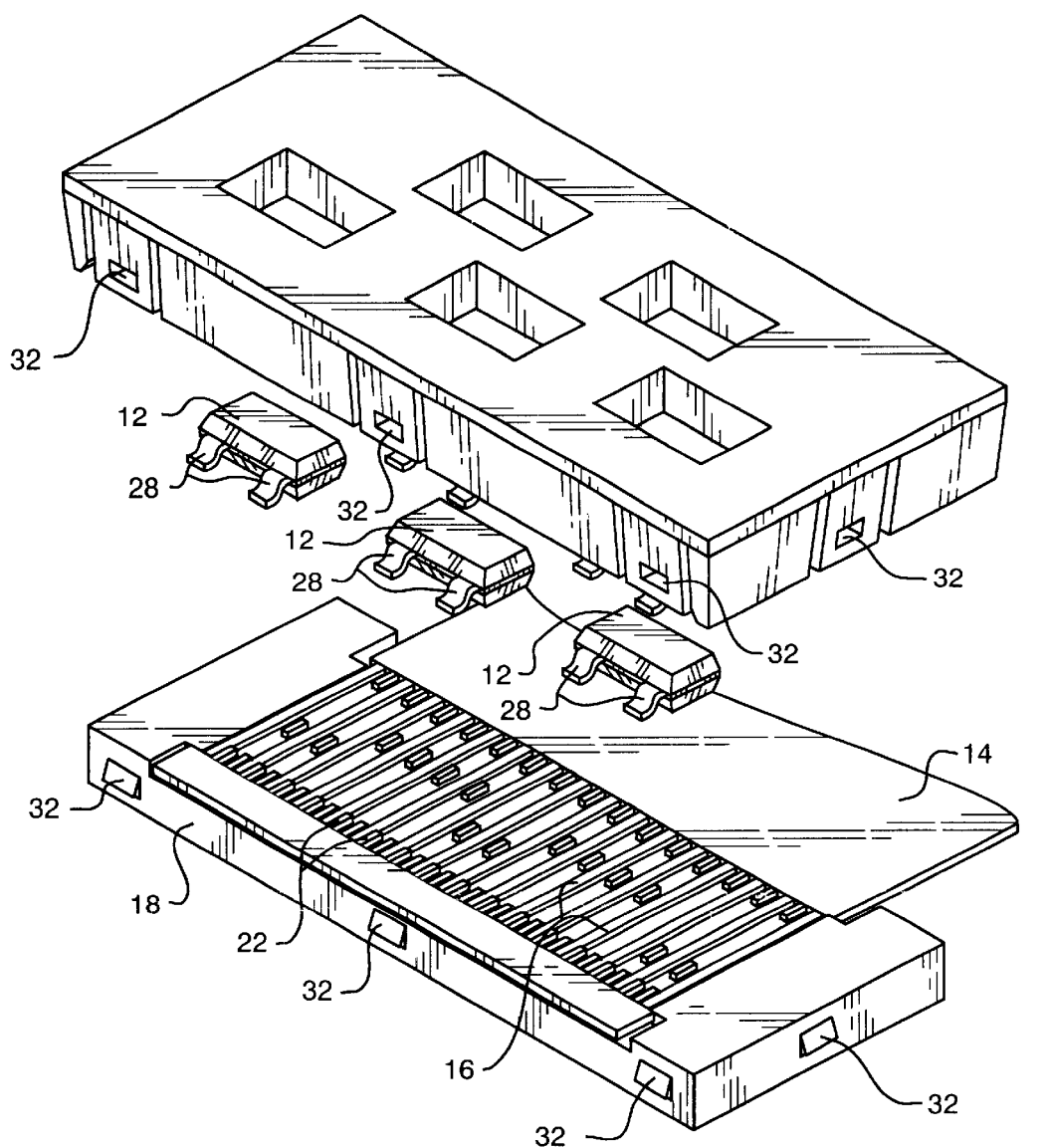
Figure 6:
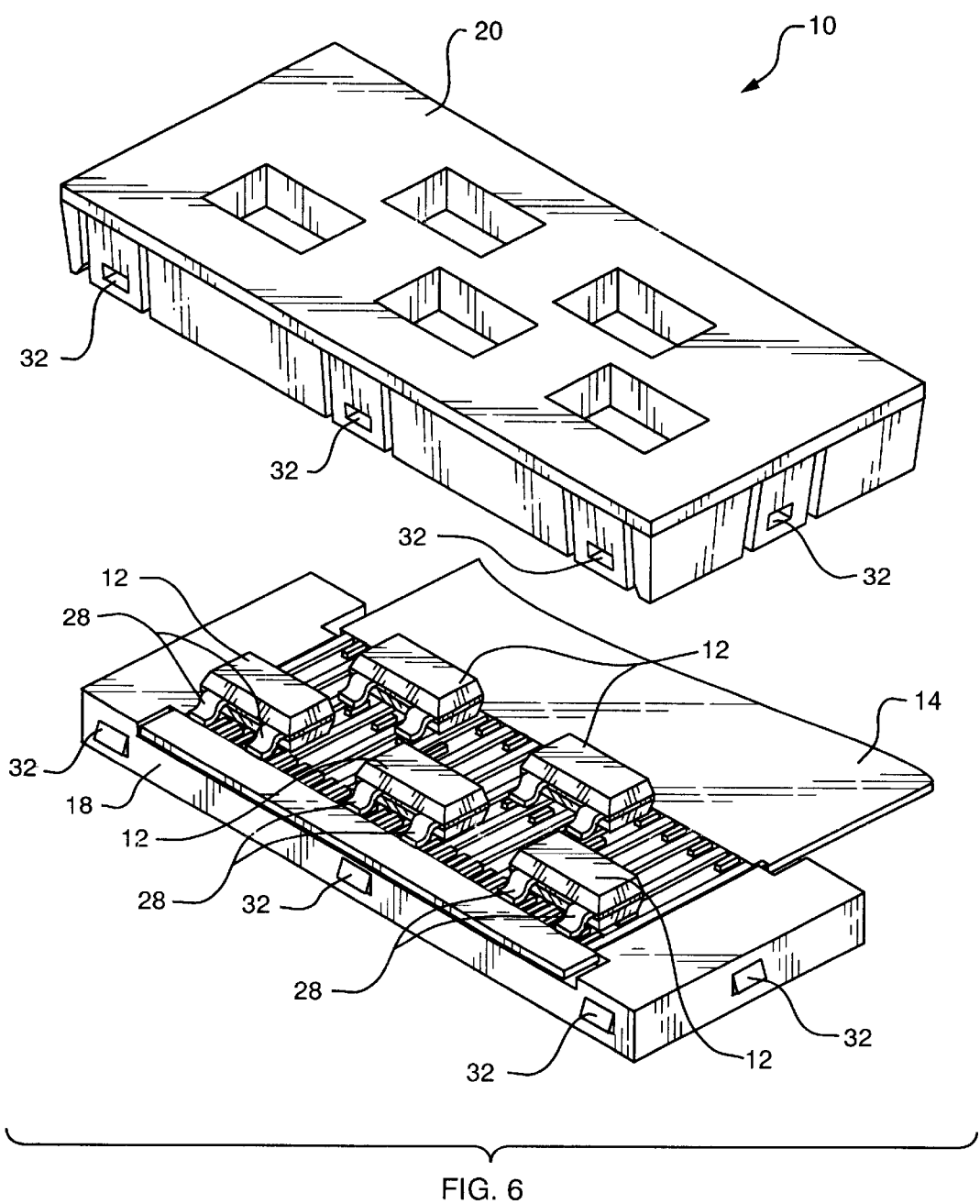

Turning now to the figures wherein like reference numerals refer to like elements throughout, a basic embodiment of the invention as shown in FIGS. 1–3, in various stages of assembly, is a component alignment casing system 10 for connecting circuits comprising at least one surface mountable component 12 and at least one prepared component 14 having a plurality of exposed traces 16; an alignment base 18 on to which the surface mountable component 12 and the prepared component 14 are laid; and a cover 20. The cover 20 may be attached with or with out the addition or aid of a resilient latch mechanism 32. Soldering is used to attach the surface mountable component 12 to the prepared component 14 while they are aligned off of the alignment base 18. The surface mountable component 12 has a plurality of exposed leads 28 which are electronically connected to the plurality of exposed traces 16 of the prepared component 14 when the component alignment casing system 10 is assembled and soldered. The prepared component 14 may typically be a flat flexible cable (FFC), a flexible printed circuit (FPC), or a round wire interconnect (RWI). The surface mount component 12 may be any surface mountable component that is attachable to a FFC, FPC, or RWI, including, but not limited to, headers, receptacles, and light emitting diodes (LED's), resistors, capacitors, switches, jacks, and any component with leads that can be soldered to a FFC, FPC, or RWI. FIGS. 4–6 illustrate an example of the invention using five LED's as surface mountable component 12, with component alignment casing system 10 in various stages of assembly.

The alignment base 18 has a plurality of alignment ribs 22 to align the plurality of exposed traces 16 of the prepared component 14, and to isolate the traces 16 from each other to prevent bridging. The alignment ribs 22 also prevent the exposed leads 28 of the surface mountable component 12 from each other when the surface mountable component 12 is laid onto the base 18.

As shown in FIGS. 1 and 2, the alignment base 18 may have at least one optional alignment recess 24 with at least one alignment hole 26 to aid in positioning the surface mountable component 12 on the alignment base 18. The surface mountable component 12 would then in accordance have at least one alignment peg 30, or similar structure, which fits in the alignment hole 26 of the alignment base 18 to aid in positioning the surface mountable component 12 on the alignment base 18. The components of the invention are preferably formed from a non-conductive material such as a plastic or like suitable substance, and are not soldered to either the prepared component 14 or the surface mountable component 12.

When the cover 20 is attached, with or without a latch mechanism 32, it provides a positive, compressive force to the conductors or leads 28 of the surface mountable component 12, pushing the leads 28 down into good contact with traces 16 of the prepared component 14, and thereby maintains a compliant force even through an oven reflow soldering process. The compressive force, in this embodiment is supplied in part by latch mechanism 32 which may be structured as shown in all of the Figures, with several pairs of interlocking components of latch mechanism 32, having one member of the pair on the cover 20 and one member on the base so that the cover 20 snaps securely onto the base 18. The interaction of the two components of latch mechanism 32 secures the cover 20 onto the base 18 under pressure, yet allows the cover 20 to be easily removed. The force supplied by the cover 20 helps displace the solder during reflow, and forces all of the leads 28 and traces 16 in question to be coplanar, which, in turn, yields a lower rework rate because there will be a better initial solder joint when the invention is assembled.

The initial solder joint is better because the force exerted by the cover 20 between the surface mountable component 12 and the prepared component 14 assures contact between the two components by pressing on the leads 28 and traces 16 to assure that they are in the same plane and therefore in good contact with each other. A common problem in this art is that during assembly, individual 'fingers' of the leads and/or traces may not be in the same reference plane, some sticking up higher than others. When this happens, contact between the substrate and the surface mountable component will not be made with some of the leads and/or traces, yielding an inadequate connection. However, with the present invention, the leads 28 and traces 16 are assured to be touching, by the compressive force from the cover 20 and latch mechanism 32.

Figure 7:
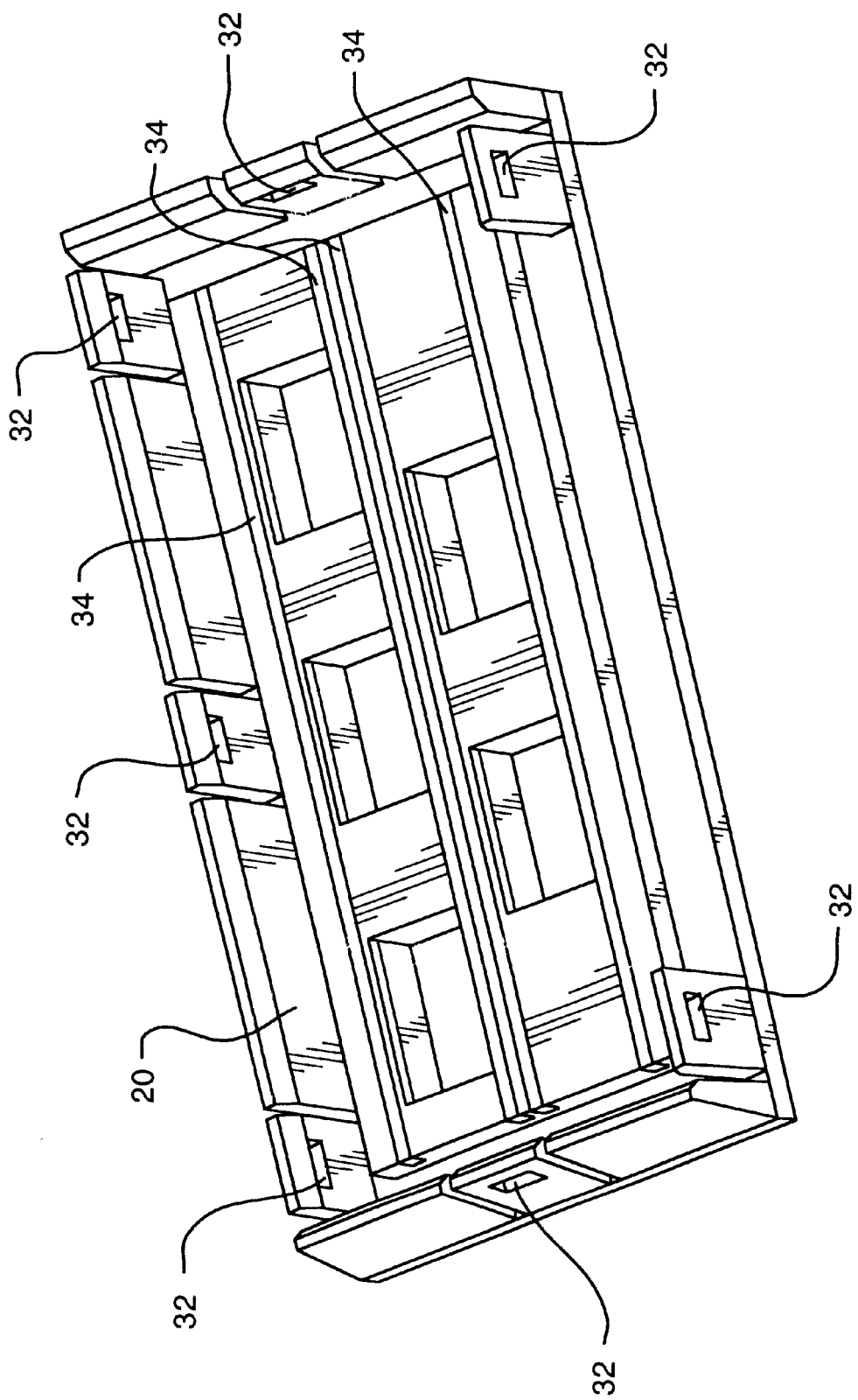
FIG. 7 is a perspective view of the cover upside down, to show spring, or spring-like mechanism in the cover.
Figure 8:
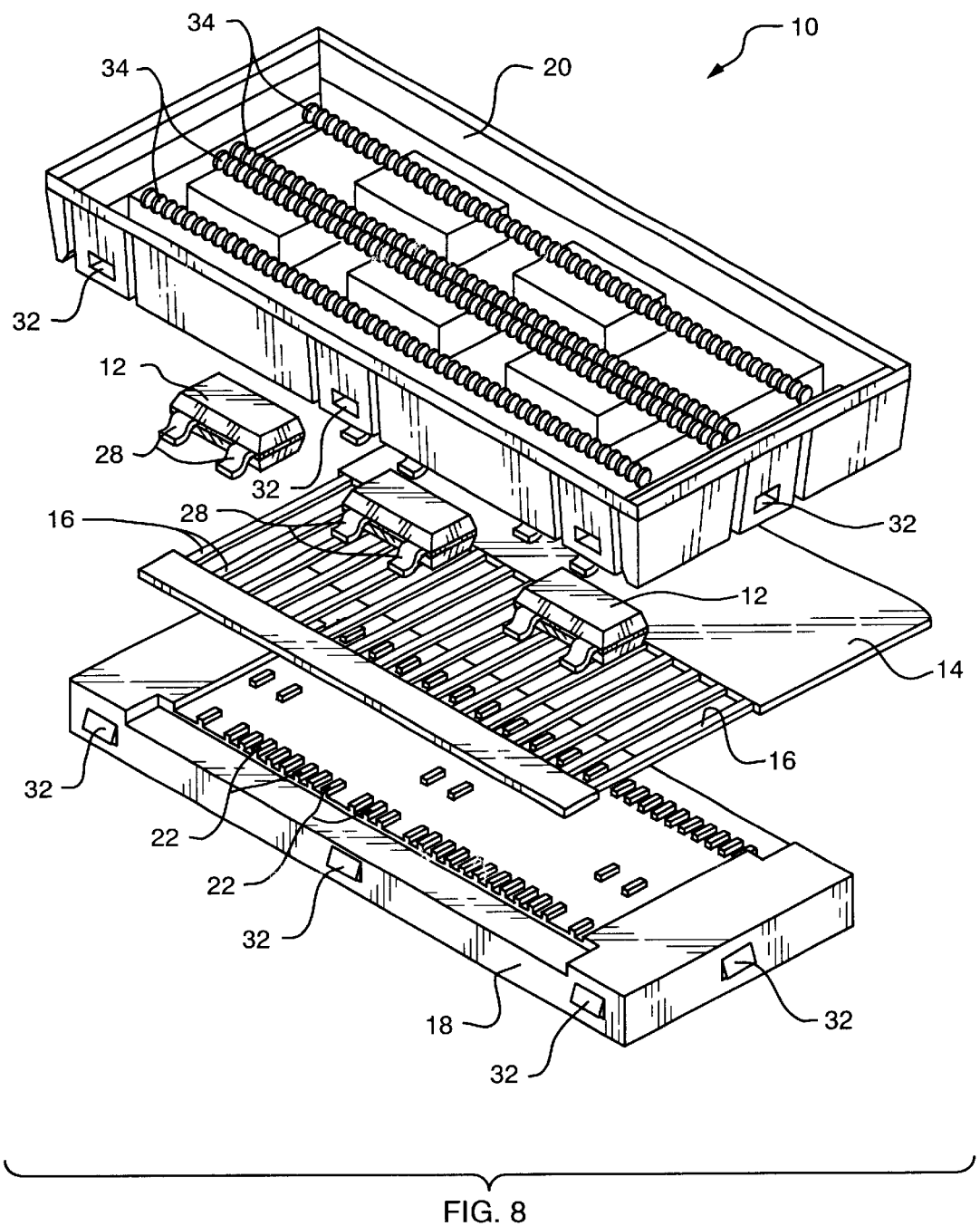
FIG. 8 is an exploded perspective view of the invention, showing assembly of the invention, using 5 LED's and with the top surface of the cover removed to show the spring or spring-like mechanism.

Cover 20 may also include a spring mechanism comprising at least one spring component 34. Spring component 34 may be a flexible, resilient material such as rubber, or rubber-like material, or a coil spring. The addition of at least one spring component 34 to cover 20 provides additional compressive force to ensure good contact between leads 28 of surface mountable component 12 and traces 16 of prepared component 14. FIG. 7 illustrates four rubber or rubber-like spring components 34, with cover 20 shown upside down, and FIG. 8 illustrates the use of four coil spring type spring components 34. The top of cover 20 is not shown in the assembly process shown in FIG. 8 so that spring components 34 may be seen.

The invention also comprises a method for forming a component alignment casing system 10 comprising the steps of overlaying a prepared component 14 comprising a plurality of exposed traces 16 therein onto an alignment base 18 which has a plurality of alignment ribs 22 to isolate and align the plurality of exposed traces 16; applying a surface mountable component 12 to the alignment base 18 overlaying the prepared component 14; electrically connecting and attaching, the exposed leads 28 of the surface mountable component 12 to the plurality of exposed traces 16 of the prepared component 14, preferably by soldering; and attaching a cover 20.

As above, the surface mount prepared components preferably usable with the method and apparatus of the invention include, but are not limited to, flat flexible cable (FFC), flexible printed circuit (FPC), and round wire interconnect (RWI), and the surface mountable components include, but are not limited to, headers, receptacles, LED's and any other suitable surface mountable component.

The invention has thus been described in detail by way of example preferred embodiments, however, variations and modifications exist within the scope and spirit of the invention as described and defined in the following claims.

What is claimed is:

1. A component alignment casing system for connecting circuits, specifically connecting at least one surface mountable component to at least one prepared component comprising a plurality of traces with insulation removed, said system comprising:

an alignment base on to which said at least one prepared component and said at least one surface mountable component are laid and aligned;

an electrically connecting substance to electrically connect said at least one prepared component and said at least one surface mountable component; and a removable compressive cover attachable to the base.

2. The component alignment casing system of claim 1 wherein said at least one surface mountable component is chosen from the group consisting of: headers, receptacles, LED's, and mountable components with leads.

3. The component alignment casing system of claim 2 wherein said at least one surface mountable component comprises a plurality of exposed leads which are electrically connected to said plurality of traces of said prepared component when said component alignment casing system is assembled and connected.

4. The component alignment casing system of claim 1 wherein said compressive cover attaches to said base with a latch means comprising a plurality of pairs of interlocking members, one member of each pair located on said cover and the corresponding member of each pair located on said alignment base whereby said cover snaps and is secured onto said alignment base.

5. The component alignment casing system of claim 1 wherein said at least one prepared component is chosen from the group consisting of: flat flexible cable (FFC), flexible printed circuits (FPC), and round wire interconnects (RWI).

6. The component alignment casing system of claim 1 wherein said alignment base comprises a plurality of alignment ribs to align said plurality of traces of said prepared component on said alignment base, and to isolate said traces from each other.

7. The component alignment casing system of claim 1 wherein said alignment base comprises at least one alignment recess with at least one alignment hole thereby aiding in positioning said surface mountable component on said alignment base.

8. The component alignment casing system of claim 7 wherein said surface mountable component comprises at least one alignment peg which fits in said at least one alignment hole thereby aiding in positioning said surface mountable component on said alignment base.

9. The component alignment casing system of claim 3 wherein said compressive cover comprises at least one spring means disposed in said compressive cover and pressed against the at least one surface mountable component thereby providing compressive force from said plurality of exposed leads of said at least one surface mountable component to said plurality of traces of said prepared component to ensure a good electrical connection.

10. The component alignment casing system of claim 9 wherein said at least one spring means comprises a coil spring.

11. The component alignment casing system of claim 9 wherein said at least one spring means comprises a flexible, resilient material.

12. A component alignment casing system for connecting circuits, specifically connecting at least one surface mountable component having a plurality of leads to at least one prepared component having a plurality of traces with Insulation removed, said system comprising:

an alignment base having a plurality of insular alignment ribs between each of which one of said plurality of traces of said prepared component and one of the plurality of leads from the surface mountable component can be overlapped; and a removable compressive cover attachable to the base.

13. The system of claim 12 wherein the cover holds each of the traces and the leads in substantial electrical contact.

14. The system of claim 12 wherein the leads and the traces are electrically bonded.

* * * * *